(12) United States Patent
Vigraham et al.

(10) Patent No.: US 10,763,883 B2
(45) Date of Patent: Sep. 1, 2020

(54) DIGITAL-TO-ANALOG CONVERTER WITH INTEGRATED COMB FILTER

(71) Applicant: Maxlinear, Inc., Carlsbad, CA (US)

(72) Inventors: Baradwaj Vigraham, Carlsbad, CA (US); Rakesh Kumar Palani, Irvine, CA (US); Suman Sah, Colorado Springs, CO (US)

(*) Notice: Subject to any disclaimer, the term of this patent is extended or adjusted under 35 U.S.C. 154(b) by 0 days.

(21) Appl. No.: 16/425,863

(22) Filed: May 29, 2019

(65) Prior Publication Data

US 2019/0372585 A1    Dec. 5, 2019

Related U.S. Application Data

(60) Provisional application No. 62/677,811, filed on May 30, 2018.

(51) Int. Cl.
*H03M 1/66* (2006.01)
*H03H 17/02* (2006.01)

(52) U.S. Cl.
CPC .......... *H03M 1/66* (2013.01); *H03H 17/0251* (2013.01)

(58) Field of Classification Search
CPC ...... H03M 1/66; H03H 17/0251; H03H 1/747
USPC ........................................................ 341/144
See application file for complete search history.

(56) References Cited

U.S. PATENT DOCUMENTS

| | | | |
|---|---|---|---|
| 6,218,974 B1* | 4/2001 | Dedic ................. | H03M 1/662 341/141 |
| 6,690,313 B1* | 2/2004 | Warren ................ | H03M 1/687 341/141 |
| 9,306,588 B2* | 4/2016 | Das ....................... | H03M 1/68 |
| 9,626,981 B2* | 4/2017 | Chesney .............. | H03M 3/424 |
| 2013/0257636 A1* | 10/2013 | Hwang ................. | H03M 1/20 341/131 |
| 2016/0173121 A1* | 6/2016 | Doare ................... | H03M 3/378 341/120 |

\* cited by examiner

*Primary Examiner* — Jean B Jeanglaude
(74) *Attorney, Agent, or Firm* — Maschoff Brennan

(57) ABSTRACT

A digital-to-analog conversion circuit (DAC) is operable to convert an input digital signal to an output analog signal. The DAC includes a digital signal processing circuit operable to process the input digital signal according to a first transfer function to generate a first processed digital signal and process the digital input signal according to a second transfer function to generate a second processed digital signal. The DAC includes a first unit DAC operable to convert the first processed digital signal to a first intermediate analog signal, and a second unit DAC operable to convert the second processed digital signal to a second intermediate analog signal. The DAC includes switching circuits and a combiner circuit to generate the output analog signal from the intermediate analog signals.

18 Claims, 6 Drawing Sheets

DIGITAL-TO-ANALOG CONVERTER WITH INTEGRATED COMB FILTER

PRIORITY CLAIM

This application claims priority to U.S. provisional patent application 62/677,811 Filed on May 30, 2018, which is hereby incorporated herein by reference in its entirety.

BACKGROUND

Limitations and disadvantages of conventional and traditional approaches to analog-to-digital converters will become apparent to one of skill in the art, through comparison of such systems with some aspects of the present invention as set forth in the remainder of the present application with reference to the drawings.

BRIEF SUMMARY OF THE INVENTION

A system and/or method is provided for a digital comb filter, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Figure 1:
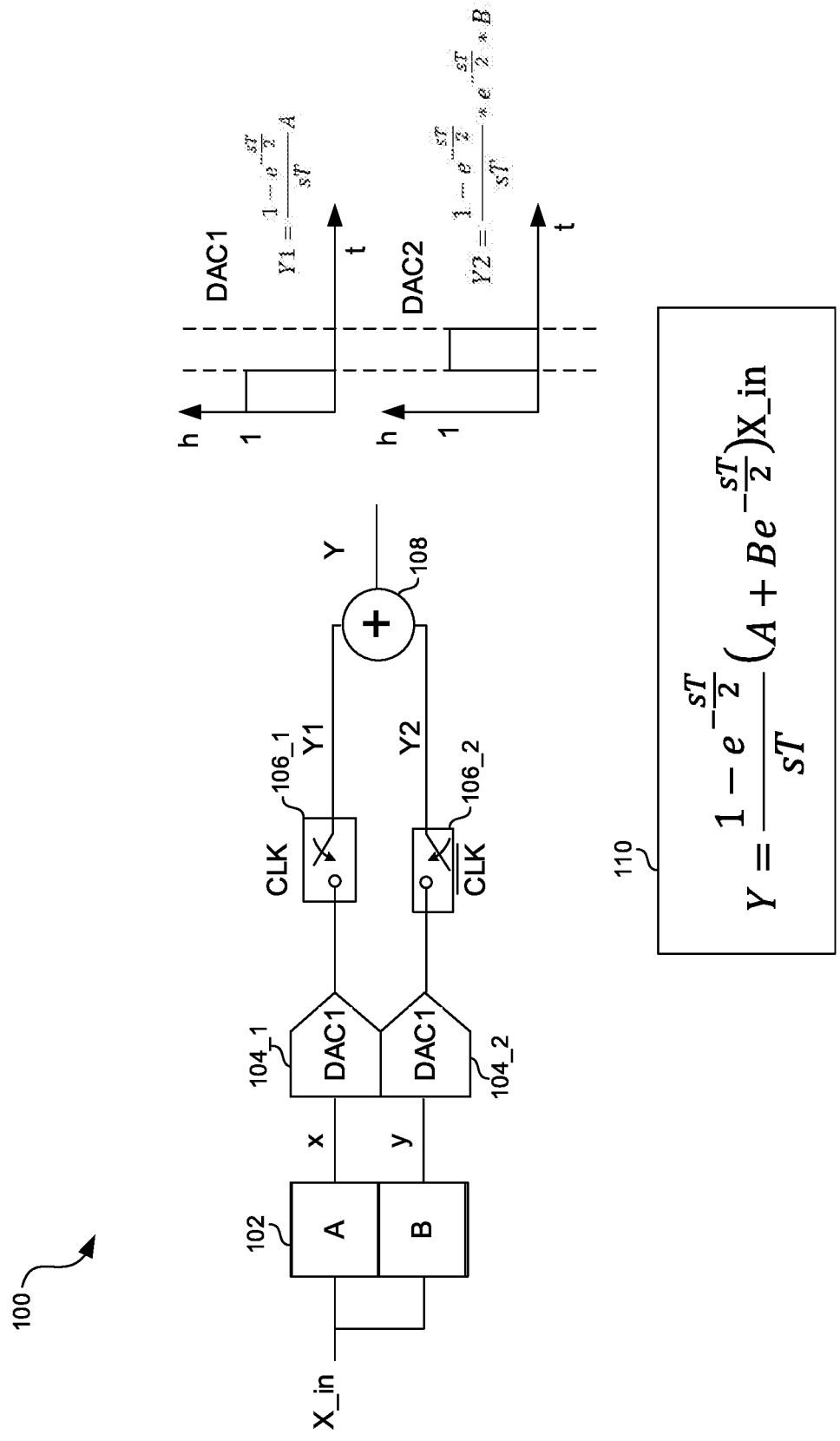
FIG. 1 shows a digital-to-analog converter with integrated comb filtering.

FIG. 1 shows a digital-to-analog converter (DAC) with integrated comb filtering. The DAC 100 comprises digital signal processing DSP circuitry 102, unit DACs 104_1 and 104_2, switches 106_1 and 106_2 and combiner 108.

The DSP circuitry 102 is operable to process the signal X_in to generate signal x=A*X_in and to generate y=B*X_in. Example transfer functions A and B are described below.

Each of the unit DACs 104_1 and 104_2 is, for example, a non-return-to-zero DAC.

Each of the switches 106_1 and 106_2 is, for example, a transmission gate comprising one or more transistors. In the example shown, 106_1 is closed and 106_2 is open when the CLK signal is high, and 106_1 is open and 106_2 is closed when the CLK signal is low.

The combiner 108 is operable to combine signals Y1 (output by switch 106_1) and Y2 (output by switch 106_2) to generate signal Y. The transfer function of the example DAC 100 is called out as 110. Y1, Y2, and Y3 are given by the following equations:

$$Y1 = \frac{1 - e^{-\frac{sT}{2}}}{sT} A$$

$$Y2 = \frac{1 - e^{-\frac{sT}{2}}}{sT} * e^{-\frac{sT}{2}} * B$$

$$Y = \frac{1 - e^{-\frac{sT}{2}}}{sT} \left( A + Be^{-\frac{sT}{2}} \right) X\_in$$

where s=jω and T is period of sampling clock CLK.

Figure 2A:
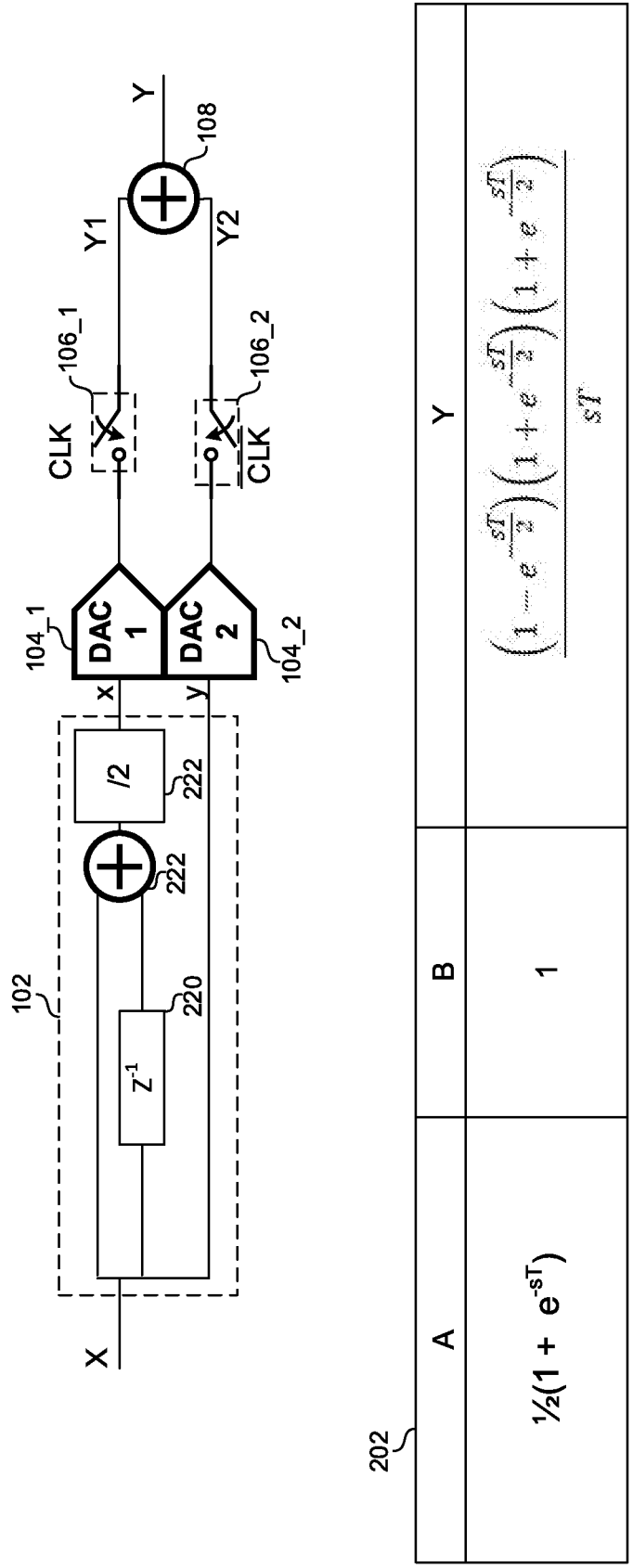
FIG. 2A shows an example first order implementation of the comb filter in DAC of FIG. 1.

FIG. 2A shows an example first order implementation of the DAC 100 of FIG. 1. In the example of FIG. 2A, the DSP circuitry 102 comprises circuitry that achieves values of A, B, and Y as shown in table 202. Specifically, A, B, and Y for this example implementation are given by the following equations:

$$A = \frac{1 + e^{-sT}}{2}$$

$$B = 1$$

$$Y = \frac{\left(1 - e^{-\frac{sT}{2}}\right)\left(1 + e^{-\frac{sT}{2}}\right)\left(1 + e^{-\frac{sT}{2}}\right)}{sT}$$

Other circuit configurations may be used to achieve the same values of A, B, and Y.

Figure 2B:
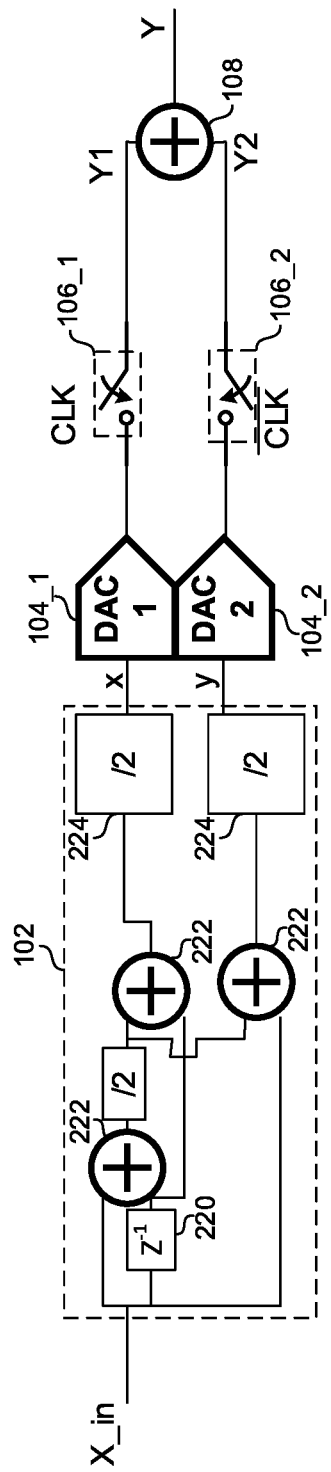
FIG. 2B shows an example second order implementation of the comb filter in DAC of FIG. 1.

FIG. 2B shows an example second order implementation of the DAC 100 of FIG. 1. In the example of FIG. 2B, the DSP circuitry 102 comprises circuitry that achieves values of A, B, and Y as shown in table 220. Other circuit configurations may be used to achieve the same values of A, B, and Y. Specifically, A, B, and Y for this example implementation are given by the following equations:

$$A = \frac{1 + 3e^{-sT}}{4}$$

$$B = \frac{3 + e^{-sT}}{4}$$

$$Y = \frac{\left(1 - e^{-\frac{sT}{2}}\right)\left(1 + e^{-\frac{sT}{2}}\right)\left(1 + e^{-\frac{sT}{2}}\right)^2}{sT}$$

Other circuit configurations may be used to achieve the same values of A, B, and Y.

Figure 2C:
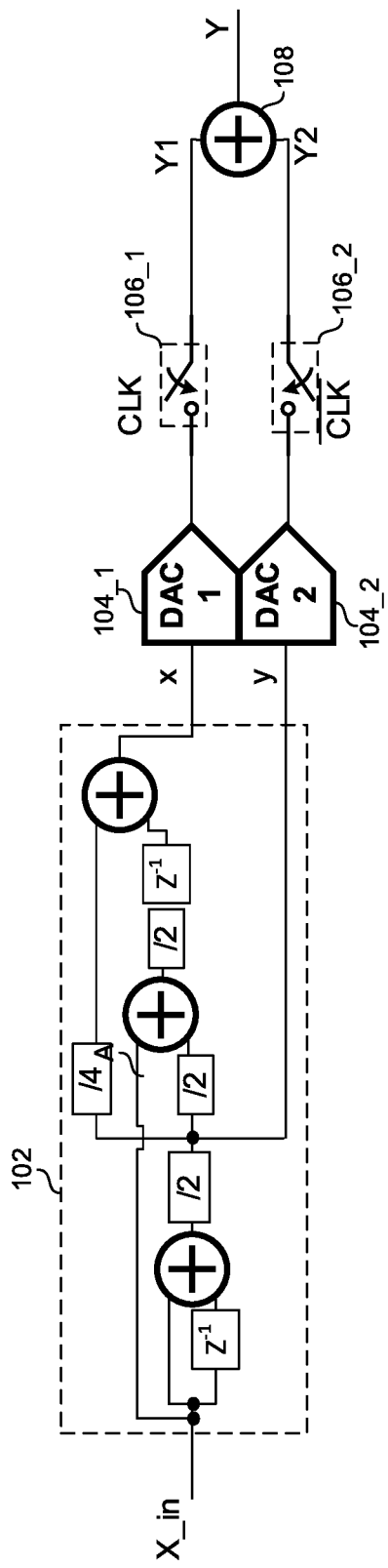
FIG. 2C shows an example third order implementation of the comb filter in DAC of FIG. 1.

FIG. 2C shows an example third order implementation of the DAC of FIG. 1. In the example of FIG. 2C, the DSP circuitry 102 comprises circuitry that achieves values of A, B, and Y as shown in table 240. Specifically, A, B, and Y for this example implementation are given by the following equations:

$$A = \frac{1 + 6e^{-sT} + e^{-2sT}}{8}$$

$$B = \frac{1 + e^{-sT}}{2}$$

$$Y = \frac{\left(1 - e^{-\frac{sT}{2}}\right)\left(1 + e^{-\frac{sT}{2}}\right)\left(1 + e^{-\frac{sT}{2}}\right)^3}{sT}$$

Other circuit configurations may be used to achieve the same values of A, B, and Y.

Figure 3:
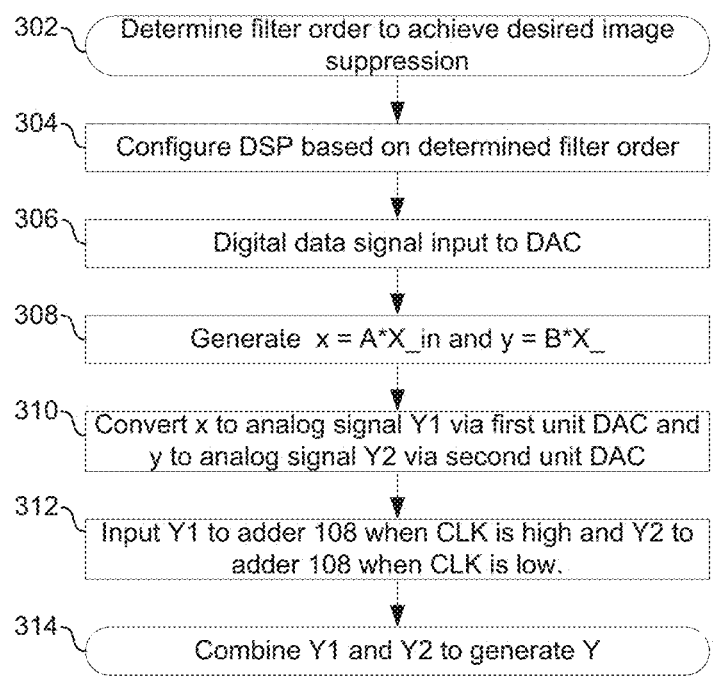
FIG. 3 is a flowchart illustrating an example process for digital-to-analog conversion using the DAC of FIG. 1.

FIG. 3 is a flowchart illustrating an example process for digital-to-analog conversion using the DAC 100 of FIG. 1.

Figure 4:
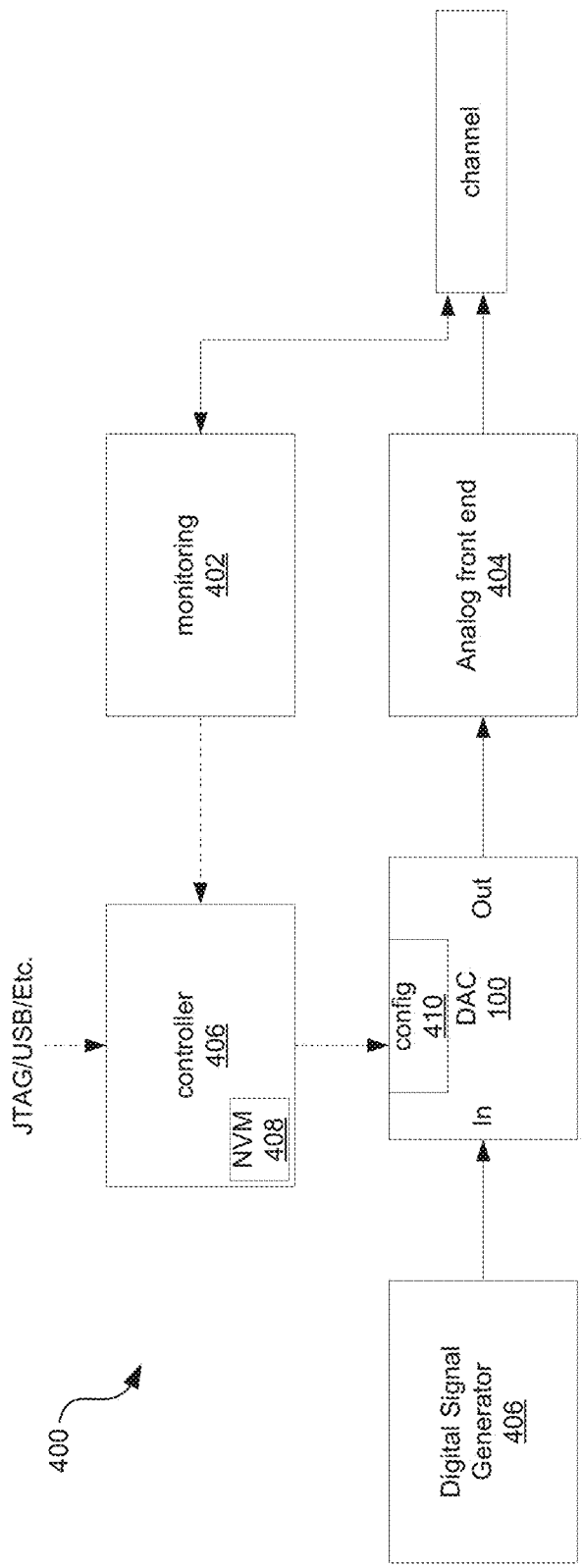
FIG. 4 shows the DAC of FIG. 1 installed in a transceiver.

The process begins with block 302 in which the filter order required to achieve a desired level of image suppression is determined. This may, for example, take place during factory calibration and/or during runtime. Configuration during factory calibration may be based on the host system into which the DAC 100 is to be installed. For example, referring briefly to FIG. 4, the DAC 100 may be configured for installation into a transceiver 400 and the configuration (e.g., stored in registers 410) may be based on the make and/or model of the transceiver 400, the make and/or model of components of the transceiver 400 (e.g., the analog front end 404), the type of network (e.g., Ethernet, 4G, 5G, etc.) and/or any other characteristics of the transceiver 400 and/or its intended use. Configuration during runtime may, for example, be in response to changes in the signal environment in which the DAC 100 is operating as, for example, indicated by a quality measure such as bit error rate. Referring to the example of FIG. 4, the transceiver 400 comprises circuitry 402 that measures one or more quality metrics of the network 408 by sending test signals into the network via the DAC and this information is used to configure the DAC 100 (e.g., via one or more lookup tables in nonvolatile memory 408).

In block 304, the DSP circuitry 102 is configured based on the filter order selected in block 302. For example, referring briefly to FIG. 4, a microcontroller 406 of the host system in which the DAC 100 resides may lookup configuration settings for the determined order in nonvolatile memory 408 and then configure one or more registers 410 of the DSP circuitry 102 to realize the desired transfer functions A and B.

Returning to FIG. 3, in block 306, digital signal X_in to be converted to analog arrives at the DAC 100.

In block 308, X_in is processed by DSP circuitry 102 to generate x=A*X_in and to generate y=B*X_in.

In block 310, unit DAC 104_1 converts x to analog signal Y1, and unit DAC 104_2 converts y to analog signal Y2.

In block 312, Y1 is input to adder 108 when CLK is high and Y2 is input to adder 108 when CLK is low.

In block 314, Y1 and Y2 are combined by combiner 108 to generate Y.

In accordance with an example implementation of this disclosure, a digital-to-analog conversion circuit (DAC) (e.g., 100) is operable to convert an input digital signal (e.g., X_in) to an output analog signal (e.g., Y). The DAC comprises a digital signal processing circuit (e.g., 102) operable to process the input digital signal according to a first transfer function (e.g., A) to generate a first processed digital signal (e.g. x), and process the digital input signal according to a second transfer function (e.g., B) to generate a second processed digital signal (e.g., y). The DAC comprises a first unit DAC (e.g., 104_1) operable to convert the first processed digital signal to a first intermediate analog signal (e.g., Y1), and a second unit DAC (e.g., 104_2) operable to convert the second processed digital signal to a second intermediate analog signal (e.g., Y2). The DAC comprises a first switching circuit (e.g., 106_1) operable to connect the first intermediate analog signal to a first input of a combiner circuit (e.g., 108) when a clock signal (e.g., CLK) is in a first state and disconnect the first intermediate analog signal from the first input of the combiner circuit when the clock signal is in a second state. The DAC comprises a second switching circuit (e.g., 106_2) operable to connect the second intermediate analog signal to a second input of the combiner circuit when the clock signal is in the second state and disconnect the second intermediate analog signal from the second input of the combiner circuit when the clock signal is in the first state. An output of the combiner circuit is the output analog signal. The system may comprise one or more transfer-function-configuration registers (e.g., 410), where the first transfer function and the second transfer function are determined based on the contents of the one or more transfer-function-configuration registers. The contents of the one or more transfer-function-configuration registers may be writable during runtime of the DAC (i.e., while the DAC is powered up and between conversions of one digital value and another). The system may comprise monitoring circuitry (e.g., 402) operable to determine a characteristic (e.g., signal to noise ratio and/or other figure of merit) of a network into which the output analog signal is to be transmitted. The system may comprise control circuitry (e.g., 406) operable to update the contents of the one or more transfer-function-configuration registers based on the determined characteristic (e.g., switch to a higher-order polynomial when the figure of merit indicates the network has degraded and switch to a lower-order polynomial when the figure of merit indicates the network has improved). The contents of the one or more transfer-function-configuration registers may be writable during runtime of the DAC. The system may comprise nonvolatile memory (e.g., 408) in which is stored one or more settings of the one or more transfer-function-configuration registers. The one or more settings may be read from the nonvolatile memory and written to the one or more transfer-function-configuration registers (e.g., during a power up sequence and/or during runtime). The digital signal processing circuit may comprise one or more delay circuits (e.g., 220), one or more adder circuits (e.g., 222) and one or more divide-by-two circuits (e.g., 224).

As used herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As used herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As used herein, the term "exemplary" means serving as a non-limiting example, instance, or illustration. As used herein, the terms "e.g.," and "for example" set off lists of one or more non-limiting examples, instances, or illustrations. As used herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.). As used herein, the term "based on" means "based at least in part on." For example, "x based on y" means that "x" is based at least in part on "y" (and may also be based on z, for example).

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the processes as described herein.

Accordingly, the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A system comprising:
   a digital-to-analog conversion circuit (DAC) operable to convert an input digital signal to an output analog signal, wherein the DAC comprises:
   a digital signal processing circuit operable to:
      process the input digital signal according to a first transfer function to generate a first processed digital signal; and
      process the input digital signal according to a second transfer function to generate a second processed digital signal;
   a first unit DAC operable to convert the first processed digital signal to a first intermediate analog signal;
   a second unit DAC operable to convert the second processed digital signal to a second intermediate analog signal;
   a combiner circuit,
   a first switching circuit operable to connect the first intermediate analog signal to a first input of the combiner circuit when a clock signal is in a first state and disconnect the first intermediate analog signal from the first input of the combiner circuit when the clock signal is in a second state; and
   a second switching circuit operable to connect the second intermediate analog signal to a second input of the combiner circuit when the clock signal is in the second state and disconnect the second intermediate analog signal from the second input of the combiner circuit when the clock signal is in the first state, wherein an output of the combiner circuit is the output analog signal.

2. The system of claim 1, comprising one or more transfer-function-configuration registers, wherein the first transfer function and the second transfer function are determined based on contents of the one or more transfer-function-configuration registers.

3. The system of claim 2, wherein the contents of the one or more transfer-function-configuration registers are writable during runtime of the DAC.

4. The system of claim 2, comprising:
   monitoring circuitry operable to determine a characteristic of a network into which the output analog signal is to be transmitted; and
   control circuitry operable to update the contents of the one or more transfer-function-configuration registers based on the determined characteristic.

5. The system of claim 2, wherein:
   the first transfer function corresponds to a first polynomial;
   the second transfer function corresponds to a second polynomial; and
   the one or more transfer-function-configuration registers determine a degree of the first polynomial and a degree of the second polynomial.

6. The system of claim 2, wherein the contents of the one or more transfer-function-configuration registers are writable during runtime of the DAC.

7. The system of claim 2, comprising nonvolatile memory in which is stored one or more settings of the one or more transfer-function-configuration registers.

8. The system of claim 7, comprising control circuitry operable to read the one or more settings from the nonvolatile memory and write the one or more settings to the one or more transfer-function-configuration registers.

9. The system of claim 1, wherein the digital signal processing circuit comprises one or more delay circuits, one or more adder circuits and one or more divide-by-two circuits.

10. A method for converting an input digital signal to an analog output signal, the method comprising:
   processing, by digital signal processing circuitry of a digital to analog converter circuit (DAC), the input digital signal according to a first transfer function to generate a first processed digital signal;
   processing, by the digital signal processing circuitry, the input digital signal according to a second transfer function to generate a second processed digital signal;
   converting, by a first unit DAC, the first processed digital signal to a first intermediate analog signal;
   converting, by a second unit DAC, the second processed digital signal to a second intermediate analog signal;
   connecting, by a first switching circuit, the first intermediate analog signal to a first input of a combiner circuit when a clock signal is in a first state;
   disconnecting, by the first switching circuit, the first intermediate analog signal from the first input of the combiner circuit when the clock signal is in a second state;
   connecting, by a second switching circuit, the second intermediate analog signal to a second input of the combiner circuit when the clock signal is in the second state; and disconnecting, by the second switching circuit, the second intermediate analog signal from the second input of the combiner circuit when the clock signal is in the first state, wherein an output of the combiner circuit is the analog output signal.

11. The method of claim 10, comprising determining, by the digital signal processing circuitry, the first transfer function and the second transfer function based on contents of the one or more transfer-function-configuration registers.

12. The method of claim 11, comprising writing, by control circuitry, the contents of the one or more transfer-function-configuration registers during runtime of the DAC.

13. The method of claim 11, comprising:
determining, by monitoring circuitry, a characteristic of a network into which the output analog signal is to be transmitted; and
updating, by control circuitry, the contents of the one or more transfer-function-configuration registers based on the determined characteristic.

14. The method of claim 11, wherein:
the first transfer function corresponds to a first polynomial;
the second transfer function corresponds to a second polynomial; and
the one or more transfer-function-configuration registers determine a degree of the first polynomial and a degree of a second polynomial.

15. The method of claim 12, comprising writing, by control circuitry, the contents of the one or more transfer-function-configuration registers during runtime of the DAC.

16. The method of claim 11, wherein one or more settings of the one or more transfer-function-configuration registers are stored in nonvolatile memory.

17. The method of claim 16, comprising reading, by control circuitry, the one or more settings from the nonvolatile memory and writing the one or more settings to the one or more transfer-function-configuration registers.

18. The method of claim 10, wherein the digital signal processing circuit comprises one or more delay circuits, one or more adder circuits and one or more divide-by-two circuits.

* * * * *